United States Patent [19]
Dokic

[11] Patent Number: 5,699,392
[45] Date of Patent: Dec. 16, 1997

[54] METHOD AND SYSTEM FOR THE RECOVERY OF AN ENCODER CLOCK FROM AN MPEG-2 TRANSPORT STREAM

[75] Inventor: Miroslav V. Dokic, Fort Wayne, Ind.

[73] Assignee: Stellar One Corporation, Bellevue, Wash.

[21] Appl. No.: 554,147

[22] Filed: Nov. 6, 1995

[51] Int. Cl.$^6$ ........................................... H04L 7/00
[52] U.S. Cl. ........................................... 375/376; 375/368
[58] Field of Search ........................... 395/371, 376, 395/362, 262, 364, 365, 368; 370/509, 514

[56] References Cited

U.S. PATENT DOCUMENTS

| | | | |
|---|---|---|---|
| 5,010,560 | 4/1991 | Jammey et al. | 377/20 |
| 5,287,182 | 2/1994 | Haskell et al. | |
| 5,381,181 | 1/1995 | Deiss | |
| 5,574,934 | 11/1996 | Mirashrafi et al. | 395/800 |

OTHER PUBLICATIONS

*Coding of Moving Pictures and Associated Audio: System* (ISO/IEC JTC1/SC 29/WG11 N0801, Published on Nov. 13, 1994, by the ISO/IEC Copyright Office, Geneva, Switzerland).

*Primary Examiner*—Stephen Chin
*Assistant Examiner*—Kevin Kim
*Attorney, Agent, or Firm*—Christensen, O'Connor, Johnson, and Kindness PLLC

[57] ABSTRACT

A clock recovery system and method for maintaining the frequency of a decoder clock at approximately the same frequency as an encoder clock based on program clock reference (PCR) values contained in a digital data stream. A voltage controlled oscillator (78) produces a decoder clock that is divided by a divider (66). The divided decoder clock clocks a 16-bit counter (64) to produce a system time clock (STC). In an exemplary embodiment, the 16-bit counter is constructed of an 8-bit hardware register (82) and an 8-bit software register (84). The 16-bit counter is initially loaded with a PCR value from the digital data stream. As subsequent PCR values are received in the data stream, a 16-bit subtractor (68) subtracts the value of the PCR from the value of the STC to produce an error signal. To produce a control signal the error signal is filtered, scaled, and added to a control variable within a low-pass filter and processor (70). The control signal is applied to the voltage controlled oscillator to adjust the oscillation frequency of the oscillator. A coarse mode of operation quickly adjusts the voltage controlled oscillator frequency, and a fine mode of operation more slowly adjusts the oscillator frequency. The two modes of operation ensure that the frequency of the decoder clock quickly approaches, and is kept approximately the same, as the frequency of the encoder clock.

20 Claims, 8 Drawing Sheets

METHOD AND SYSTEM FOR THE RECOVERY OF AN ENCODER CLOCK FROM AN MPEG-2 TRANSPORT STREAM

FIELD OF THE INVENTION

The invention relates to use of clock-synchronizing information in a digital data stream and, more particularly, to synchronization of a decoder clock with an encoder clock that provides program clock reference (PCR) values in a digital data stream.

BACKGROUND OF THE INVENTION

One standard that has been proposed for the multiplexing of bit streams from several audio, video, and/or auxiliary data sources has been developed by the ISO Moving Picture Experts Group (MPEG) and set forth in draft form in a document entitled Coding of Moving Pictures and Associated Audio (ISO/IEC JTC1/SC29/WG11N0801, published on Nov. 13, 1994, by the ISO/IEC Copyright Office, Geneva, Switzerland, hereby incorporated by reference). A first draft of the audio-video coding standard was referred to as MPEG-1, while a second draft of the standard is referred to as MPEG-2. The MPEG standards provide for the transmission of digital information from multiple signal sources by dividing the digital data into a number of packets. The packets are then multiplexed onto a single data channel, allowing a relatively large number of users to transmit and receive data over a common data channel.

Figure 1:
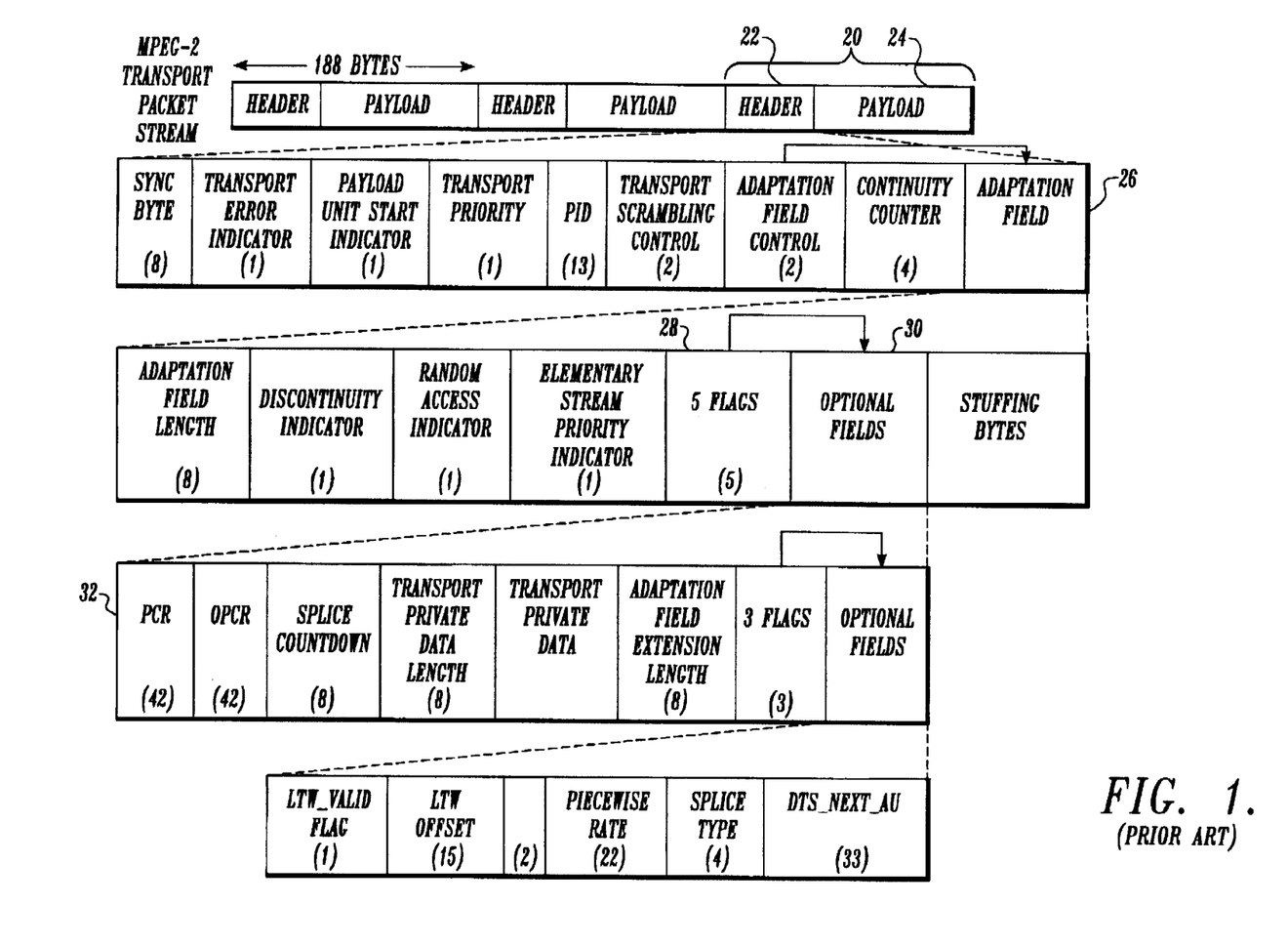
FIG. 1 is a diagram of the MPEG-2 transport stream syntax, having an embedded 42-bit program clock reference (PCR) value.

The transport stream syntax required by the MPEG-2 audio-video coding standard is shown in FIG. 1. All audio, video, and auxiliary information to be carried within a given data channel is divided into 188 byte long transport packets 20. Each transport packet 20 is subdivided into a header 22 and a payload 24. The header carries information to identify the type of data that is carried within the payload and information required to decode the transport packet stream. In particular, an adaptation field 26 may be provided within the header with a set of five flags 28 to indicate the presence of optional fields 30. Of importance to the present application is the presence of a program clock reference (PCR) value 32. The PCR is a 42-bit value that represents time stamps from a relative system time clock (STC) that is clocked by an encoder clock within an MPEG-2 encoder. Of the 42 bits, the first 33 bits of the PCR are referred to as the PCR base, and express a value of the encoder system time clock in 90 kHz time base units. The remaining nine bits of the PCR value are referred to as the PCR extension, and express a value of the system time clock in 27 MHz (modulo 300) time base units. The MPEG-2 standard requires that the PCR must be provided at intervals of no more than 100 ms in the transport stream.

The PCR values within the MPEG-2 transport stream are used to accurately recover the encoder clock in the MPEG-2 decoder. It is necessary to maintain accurate synchronization between the encoder clock used to encode the data and the decoder clock used to decode the data in order to properly demultiplex and decode the audio and the video data. The transport stream is provided with presentation time-stamps (PTSs) to indicate to the MPEG-2 decoder when to present the individual flames of video and audio data to the user. The value of each PTS is ultimately dictated by the frequency of the encoder clock in the encoder, which clocks a system time clock in the MPEG-2 encoder. When encoding the data, the MPEG-2 encoder inserts the PTSs into the transport stream based on samples of the system time clock. The decoder clock in the MPEG-2 decoder must therefore operate at the same frequency as the encoder clock in the encoder if the data are to be properly presented to a user. For purposes of this description, "synchronization" between the encoder clock and the decoder clock implies that the clocks are operating at the same frequency, but with a possible phase offset between them.

Assuming an error free environment, synchronizing the encoder and decoder clocks eliminates frame skips or frame holds that occur when displaying the transmitted data. A frame skip occurs when data is received later than its presentation time stamp denotes. When viewing the video data that has one or more frames lost, a jump in the displayed picture will result. A frame hold occurs when the buffer within the decoder receives insufficient audio or video data to perform the decoding. When no data is available for display because of a buffer underflow, most video decoders will repeat the current video frame to the user. A frame hold therefore appears to a viewer as a slight stutter on the picture screen as the same video frame is displayed twice. Obviously, it would be advantageous to eliminate any frame skips or frame holds during the operation of a decoder to provide a user with the best picture and sound quality possible from the received audio and video data.

A difference in the encoder and decoder clock will contribute to the occurrence of a frame skip or a frame hold. For example, if an encoder clock is operating at a frequency slightly less than 27 MHz and a decoder clock is operating at a frequency slightly greater than 27 MHz, eventually the relative time represented by each clock will be separated by a time equal to the time it takes to display one frame of audio or video data. In most video decoders, a difference of one frame time is sufficient to cause a frame skip or a frame hold. Even clocks operating within a relatively close frequency of each other will eventually vary sufficiently to cause a frame skip or a frame hold, a condition that is annoying to a viewer.

Figure 2:
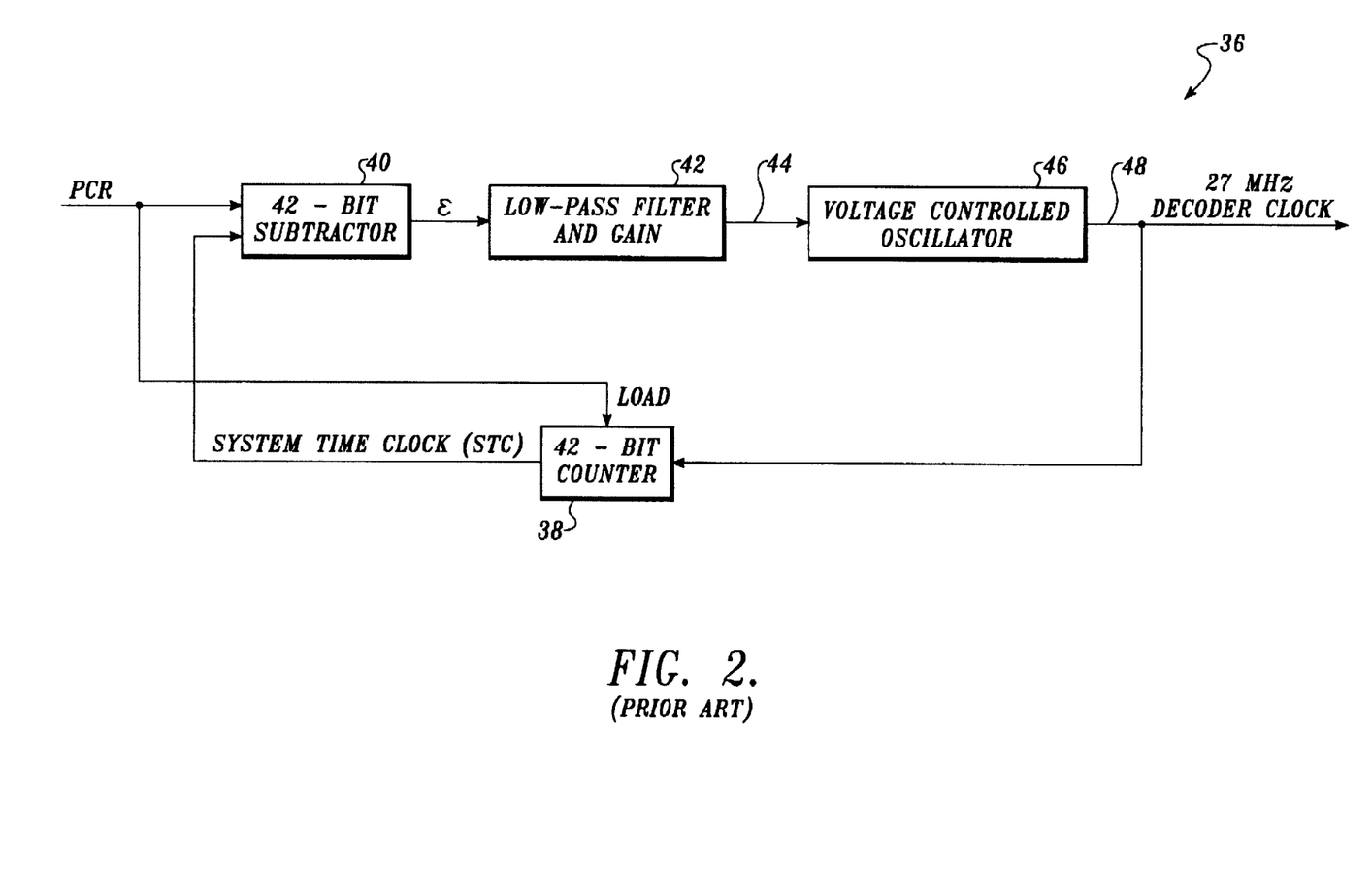
FIG. 2 is a block diagram of a prior art clock recovery system for recovery of an encoder clock from received PCR values.

To synchronize the MPEG-2 decoder clock with the MPEG-2 encoder clock, the MPEG-2 standard suggests that the PCR values be used to implement a clock recovery system. FIG. 2 is a suggested architecture for a clock recovery system 36 that is provided in the Annex D of the MPEG-2 standard. In clock recovery system 36, a first PCR value is initially loaded into a counter 38 during system start-up. Counter 38 is a 42-bit counter, comprised of a 33-bit register that is clocked by a 90 kHz clock, and a 9-bit register (modulo 300) that is clocked by a 27 MHz decoder clock. The registers are each incremented by one for each 90 kHz or 27 MHz clock pulse, respectively. A relative system time clock (STC) value produced by the 42-bit counter is applied to a 42-bit subtractor 40. Upon receipt of a PCR value in the transport system, the 42-bit subtractor subtracts the STC from the PCR. If the rate of change of the STC maintained in the 42-bit counter is equal to the rate of change of the received PCR, the decoder clock is running at the same frequency as the decoder clock in the encoder (assuming no network jitter has been introduced). If the rates of change of the PCR and the STC differ, however, the decoder clock is running at a different frequency than the clock within the encoder. If the oscillation frequencies differ, the oscillation frequency of the decoder clock must be varied to synchronize the decoder clock with the encoder clock. It will be appreciated that the derivatives of the differences between the STC and PCR are compared, and not the difference between the two values themselves. An absolute difference may exist between the STC and PCR values in the clock recovery system. If the encoder clock is synchronized with the decoder clock, however, the absolute difference will remain constant.

To maintain synchronization, a phase-locked loop is provided in the clock recovery system. When the PCR value differs from the STC value, the 42-bit subtractor provides the difference as an error signal ∈ to a low-pass filter and gain block 42. The low-pass filter removes any high-frequency variations in the error signal and slows the response of the phase-locked loop to minimize system oscillations. The error signal is then amplified and converted to an analog control signal that is applied on a control line 44 to a voltage controlled oscillator 46. For an MPEG-2 transport stream, the voltage controlled oscillator 46 operates at a nominal oscillation frequency of 27 MHz and has a control input allowing the oscillation frequency to be varied proportionally to an input control voltage. That is, the frequency of the oscillator may be adjusted within a small range surrounding the 27 MHz nominal frequency. Application of the control signal to the voltage controlled oscillator therefore increases or decreases the oscillation frequency of the voltage controlled oscillator to adjust the frequency towards the oscillation frequency of the clock within the encoder. Voltage controlled oscillator 46 outputs a 27 MHz decoder clock on a line 48. The decoder clock is used to demultiplex and decode the audio and video data contained in the MPEG-2 transport stream. To complete the phase-locked loop, the decoder clock is also used to clock the 42-bit counter 38.

A PCR is provided in the MPEG-2 transport stream at least ten times a second, ensuring that the frequency of the voltage controlled oscillator is adjusted at the same rate. The clock recovery system 36 therefore allows the decoder clock to closely track the encoder clock based on the received PCR values.

As discussed with respect to FIGS. 1 and 2, the MPEG-2 standard suggests an architecture for recovering the encoder clock from the PCR values contained in the transport stream. Unfortunately, implementing the suggested recovery system has proven to be difficult to achieve. In part, the hardware architecture has been avoided because it is expensive to construct a decoder with a 42-bit counter and a 42-bit subtractor. If the MPEG-2 decoder containing the clock recovery system is to be produced for commercial applications, it is important to minimize the manufacturing cost of each decoder. Moreover, 42-bit counters and subtractors are difficult to design and work with, a point underscored by the fact that a practical implementation that utilizes the full 42-bit PCR value does not appear to have been achieved to date. It therefore would be advantageous to develop a clock recovery system that does not require expensive parts or a complex hardware design.

In an attempt to avoid the expense of the suggested MPEG-2 hardware architecture, MPEG-2 decoders have been developed that recover an encoder clock using only software routines. In a typical software solution, the transport stream packets are stored in a large memory buffer as they are received. PCRs within the transport packets are then recalled from memory and compared with a STC maintained by a microprocessor. This software method for recovery of the encoder clock has proven to be unsuccessful, however, because the time sense that is inherently associated with the PCR is usually lost by the time that the software routine processes the PCR.

Due to the difficulties in implementing the suggested MPEG-2 hardware solution for clock recovery, and the timing problems inherent in recovering a clock using a purely software solution, several MPEG-2 decoders have opted to forgo clock recovery. These solutions focus on maintaining an accurate 27 MHz clock in the decoder, on the assumption that the encoder clock will also be closely kept at 27 MHz. However, as discussed above, even a small difference between the encoder clock and the decoder clock will eventually cause the decoder buffers to underflow or overflow. Solutions that have attempted to operate without synchronizing with the PCR values have therefore had problems with buffer misbehavior, frame holds, frame skips, and similar anomalies.

It would be advantageous to develop a clock recovery system that maintains the decoder clock at the same frequency as the encoder clock using the PCR values from an MPEG-2 transport stream. Moreover, the clock recovery system must have a minimum of hardware involved in order to minimize the cost of the overall system and allow the system to be mass produced. The disclosed clock recovery system is directed to overcoming the problems described above.

SUMMARY OF THE INVENTION

A clock recovery system and method is disclosed for maintaining the frequency of a decoder clock at approximately the same frequency as an encoder clock based on program clock reference (PCR) values contained in a digital data stream. The clock recovery system includes a phase-locked loop with a voltage controlled oscillator. The voltage controlled oscillator produces a 27 MHz decoder clock that must be closely synchronized with the encoder clock generating the digital data stream. In a preferred embodiment of the invention, the decoder clock produced by the voltage controlled oscillator is divided by 300, and applied to a 16-bit counter that maintains a system time clock (STC). When a PCR value is received in the transport stream, a 16-bit subtractor subtracts the STC from the least significant 16-bits of the PCR base. The subtractor generates an error signal that adjusts the output frequency of the voltage controlled oscillator. The clock recovery system is suitable for use in an MPEG-2 decoder because the decoder clock frequency is closely synchronized with the encoder clock by comparison of the local STC values with received PCR values.

In accordance with one aspect of the invention, the 16-bit counter is implemented using an 8-bit hardware register and an 8-bit software register. The 8-bit hardware register maintains the least significant 8-bits of the 16-bit system time clock. Upon rollover of the eight least significant bits, an interrupt is generated by the hardware register to increment the software register. The software register maintains the most significant 8-bits of the 16-bit system time clock. The system time clock is therefore implemented using a hybrid hardware/software architecture.

In accordance with another aspect of the invention, a software routine is disclosed for governing the response of the phase-locked loop. The software routine causes the phase-locked loop to track in one of two modes. In a coarse mode, the frequency of the decoder clock is quickly adjusted to lock the decoder clock with the encoder clock. In a fine mode, smaller adjustments are made to the oscillation frequency of the decoder clock to ensure that the decoder clock closely tracks any changes in the encoder clock. The two modes of operation allow the clock recovery system to quickly match, and continue to accurately track, the encoder clock during decoding operations.

It will be appreciated that several advantages arise from the clock recovery system architecture disclosed herein. In particular, using a 16-bit counter greatly reduces the amount of hardware that must be included within an MPEG-2 decoder. This reduces the overall cost of the clock recovery system, minimizing the cost of commercial MPEG-2 decoders. Additionally, the use of two tracking modes within the phase-locked loop decreases the acquisition time of a new channel clock, allowing the decoder to quickly acquire new channels. Finally, because the encoder clock is accurately tracked during decoder operation, the disclosed clock recovery system ensures that video buffer overflow or underflow will not occur. Proper presentation of the received MPEG-2 video and audio data to a viewer is therefore ensured.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 3:
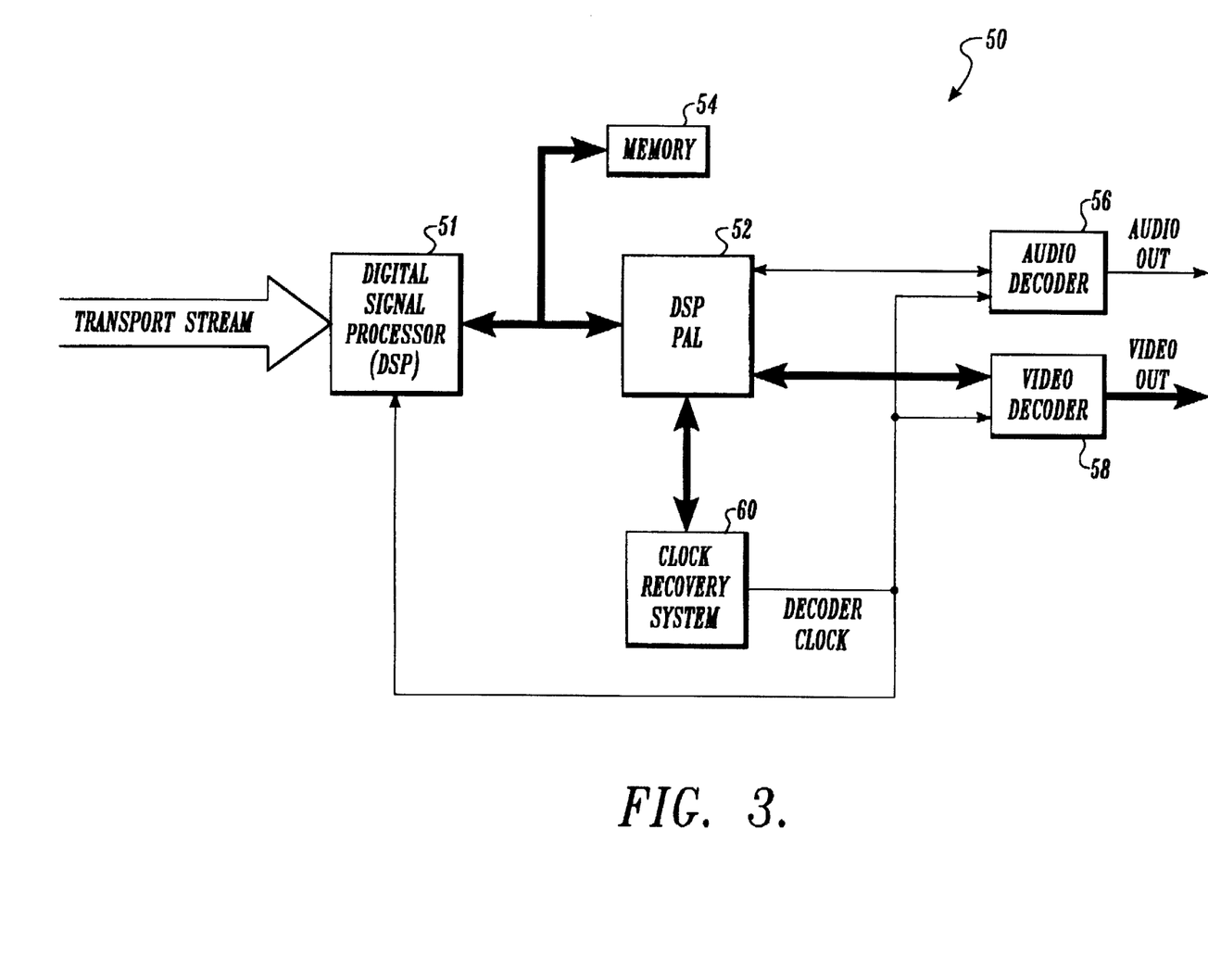
FIG. 3 is a block diagram of a preferred embodiment of an MPEG-2 decoder in which a clock recovery system of the present invention is implemented.

FIG. 3 is a block diagram of a portion of an audio/video demultiplexer and decoder 50 in which the present clock recovery system can be incorporated. The clock recovery system can be used in other systems having different architectures, however, applicant has found the architecture disclosed in FIG. 3 to be particularly suited to decoding audio and video data received in a Motion Pictures Expert Group (MPEG) MPEG-2 transport stream. Further information about the hardware architecture is described in a concurrently filed copending U.S. patent application Ser. No. 08/554,155, entitled "MPEG-2 Transport Stream Decoder Having Decoupled Hardware Architecture" (commonly assigned to the assignee of the present application, and expressly incorporated herein by reference).

In MPEG-2 demultiplexer and decoder 50, a digital signal processor 51 is provided to demultiplex an MPEG-2 transport stream into its constituent audio and video parts. The digital signal processor processes the transport stream as the stream is received, and demultiplexes the data stream based upon the content of the transport packet headers contained in the stream. By properly identifying the payload content in each received transport packet, the digital signal processor separates the audio, video, and control information. Using a technique that is beyond the scope of the present application, the audio and video information is stored in a memory 54 before being transferred to an audio decoder 56 and a video decoder 58. To assist in these transfers, a programmable array logic (PAL) chip 52 is provided to address the memory and the decoders. Further information about the demultiplexing and synchronization of the MPEG-2 data is provided in the copending application mentioned above, and in a concurrently filed copending U.S. patent application Ser. No. 08/554,146, entitled "Method for Ensuring Synchronization of MPEG-1 Data Carried in an MPEG-2 Transport Stream" (commonly assigned to the assignee of the present application, and expressly incorporated herein by reference).

For accurate reproduction of the audio and video programming carried in the transport stream, it is imperative that the decoder clock contained within decoder 50 oscillate at the same frequency as the encoder clock used to encode the transport stream and the program clock reference (PCR) values. As part of the processing of the MPEG-2 transport stream, the digital signal processor 51 removes the PCR values from the stream. Using a method described in further detail below, the PCR values in the transport stream are used to adjust the oscillation frequency of a decoder clock generated by a clock recovery system 60. The clock recovery system ensures that the decoder clock is synchronized with the encoder clock that was used to encode the MPEG-2 transport stream. The decoder clock is provided to the digital signal processor, the audio decoder, and the video decoder to ensure accurate demultiplexing and decoding of the received audio and video data.

Figure 4:
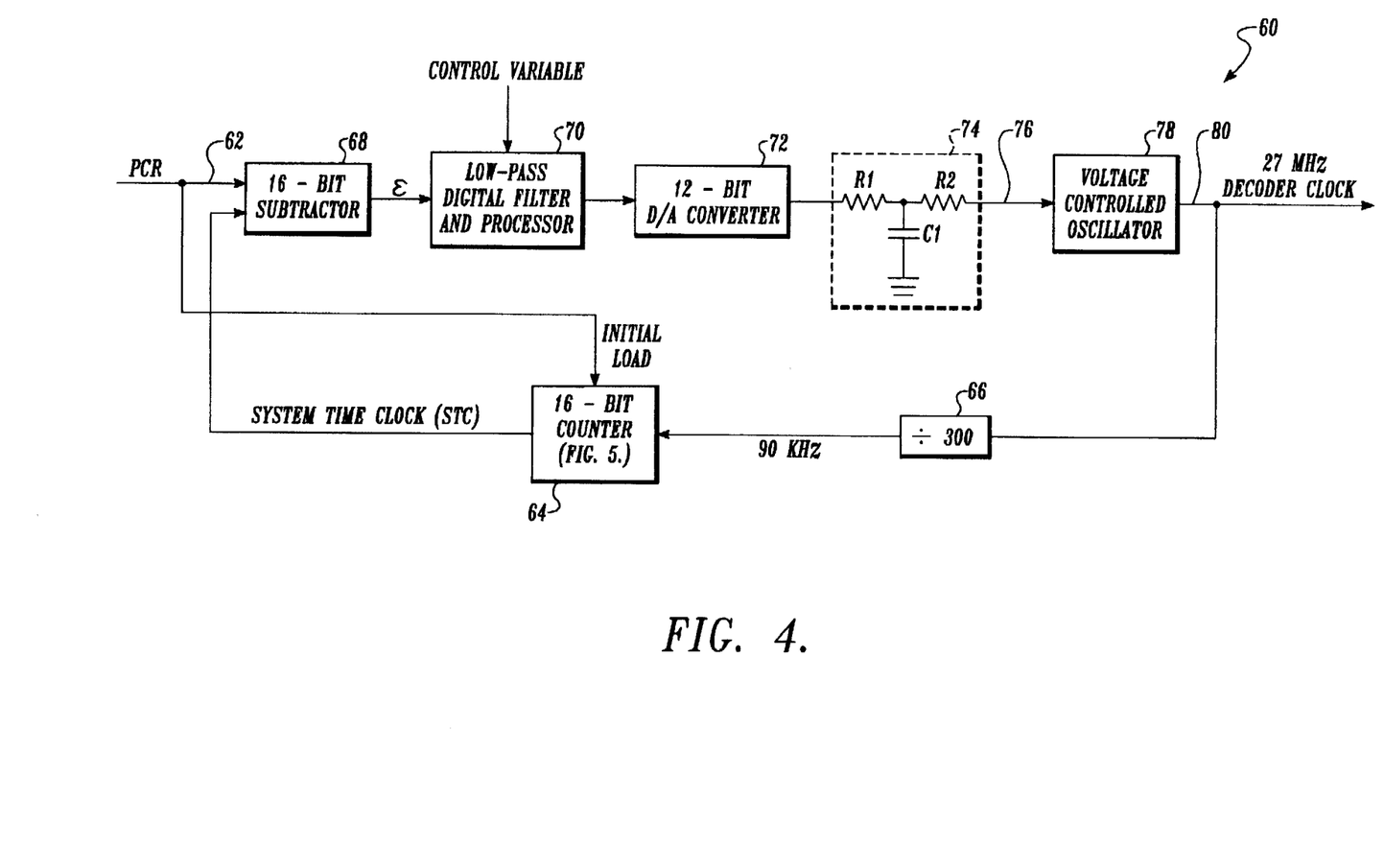
FIG. 4 is a block diagram of the clock recovery system of the present invention for recovery of an encoder clock from received PCRs using a 16-bit counter.

A block diagram of the clock recovery system 60 constructed in accordance with the present invention is shown in FIG. 4. When the clock recovery system is initialized, the first PCR value recovered from the MPEG-2 transport stream is loaded into a 16-bit counter 64. The 16-bit counter 64 is shown in greater detail in the block diagram of FIG. 5 as being comprised of an 8-bit hardware register 82 and an 8-bit software register 84. The least significant 8 bits (bits 0–7) of the PCR base are loaded into the hardware register, and the next most significant 8 bits (bits 8–15) of the PCR base are loaded into the software register. The initial load is controlled by the application of a control signal on load line 86. It will be appreciated that during the initialization process, the remaining bits of the PCR are discarded. Thus, the 9-bit extension of the PCR and the 17 most significant bits of the PCR base are not used in the preferred clock recovery system.

Figure 5:
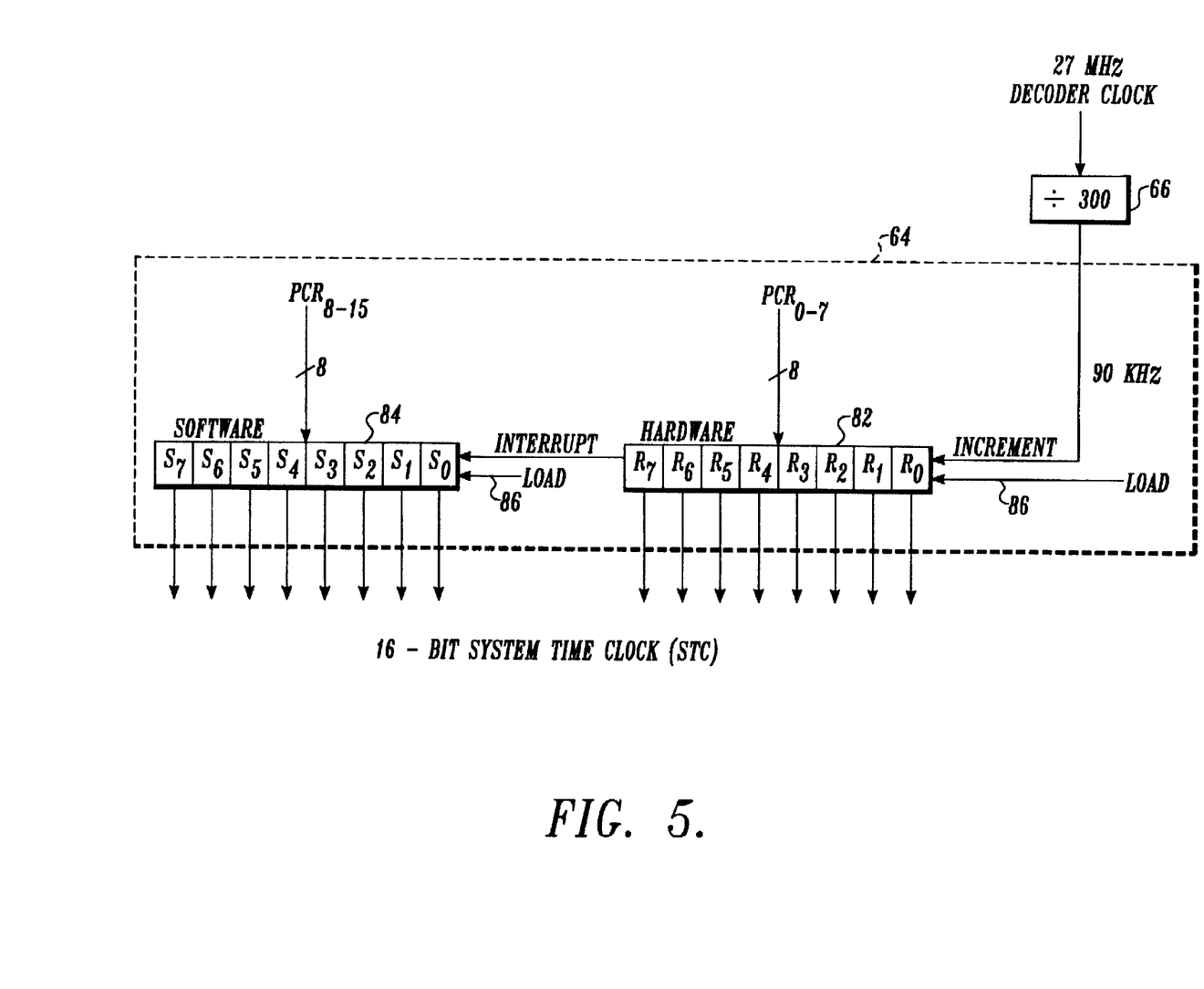
FIG. 5 is a block diagram of the 16-bit counter, the 16-bit counter being comprised of an 8-bit hardware register and an 8-bit software register.

With reference to FIG. 4, the 16-bit counter is clocked by a 90 kHz clock that is produced by dividing the 27 MHz decoder clock by 300. A divider 66 is provided to perform the required division of the decoder clock to the desired frequency, a frequency that is dictated by the clock units of the least significant bit of the PCR base. The 90 kHz clock is used to increment the 8-bit hardware register 82. When the hardware register reaches a value of 255, the register rolls over to zero. Upon rollover of the hardware register, an interrupt is generated indicating that the most significant eight bits maintained in the software register should be incremented. A software routine handles incrementing the software register. Using the preferred timing disclosed herein, an interrupt is therefore generated approximately every 2.84 milliseconds. When reading the 16-bit value contained in counter 64, the lower eight bits are read from the hardware register, and the upper eight bits are read from the software register.

The 16-bit value maintained by counter 64 represents the system time clock (STC). The counter was initialized with the first received PCR value, and is clocked by the decoder clock. If the encoder clock and the decoder clock are operating at the same frequency, the difference between the local STC and received PCR values will be zero or a constant value. If, however, the decoder clock varies from the encoder clock, the rate of change of the STC will be different from the rate of change of the PCR values received in the MPEG-2 transport stream.

To maintain the synchronization between the encoder clock and the decoder clock, a phase-locked loop is provided to adjust the frequency of the decoder clock. A 16-bit subtractor 68 initially subtracts the STC value from the PCR value. The difference between the two clock values is provided as an error signal e to a low-pass digital filter and processor 70. The filter removes high frequency variations that may have been caused by bit errors introduced into the PCR during transmission. The low-pass filter also slows the response time of the decoder clock to reduce unwanted oscillations.

After filtering, the error signal s is also scaled and added by the filter and processor 70 to a control variable. On start-up the control variable is preselected to center the oscillation frequency of the decoder clock at a desired frequency, preferably 27 MHz. During subsequent operation, the control variable is varied in a manner described below with respect to the software routine represented in FIGS. 6A–6C. The sum of the control variable and the error signal is applied to a 12-bit digital-to-analog converter 72 as a digital control signal. The digital-to-analog converter converts the digital control signal into an analog control signal that is applied to an analog low-pass filter 74. In an exemplary embodiment of the invention, the low-pass filter is a passive network that consists of a resistor R1 in series with resistor R2, and a capacitor C1 connected between resistor R1, resistor R2, and ground. The filtered control signal is then applied on a line 76 to a control input of a voltage controlled oscillator 78.

In one embodiment of the invention suitable for use in an MPEG decoder, voltage controlled oscillator 78 produces a 27 MHz decoder clock on a line 80. An application of a voltage to the control input of the voltage control oscillator allows, however, the oscillation frequency of the oscillator to be adjusted within a limited range. The analog control signal applied on line 76 therefore adjusts the oscillation frequency of the voltage controlled oscillator to more closely align the frequency of the decoder clock produced by the voltage controlled oscillator with the frequency of the encoder clock. It will be appreciated that the decoder clock is used by the MPEG-2 decoder to accurately demultiplex and display the audio and video data received in the MPEG-2 transport stream.

Figure 6A:
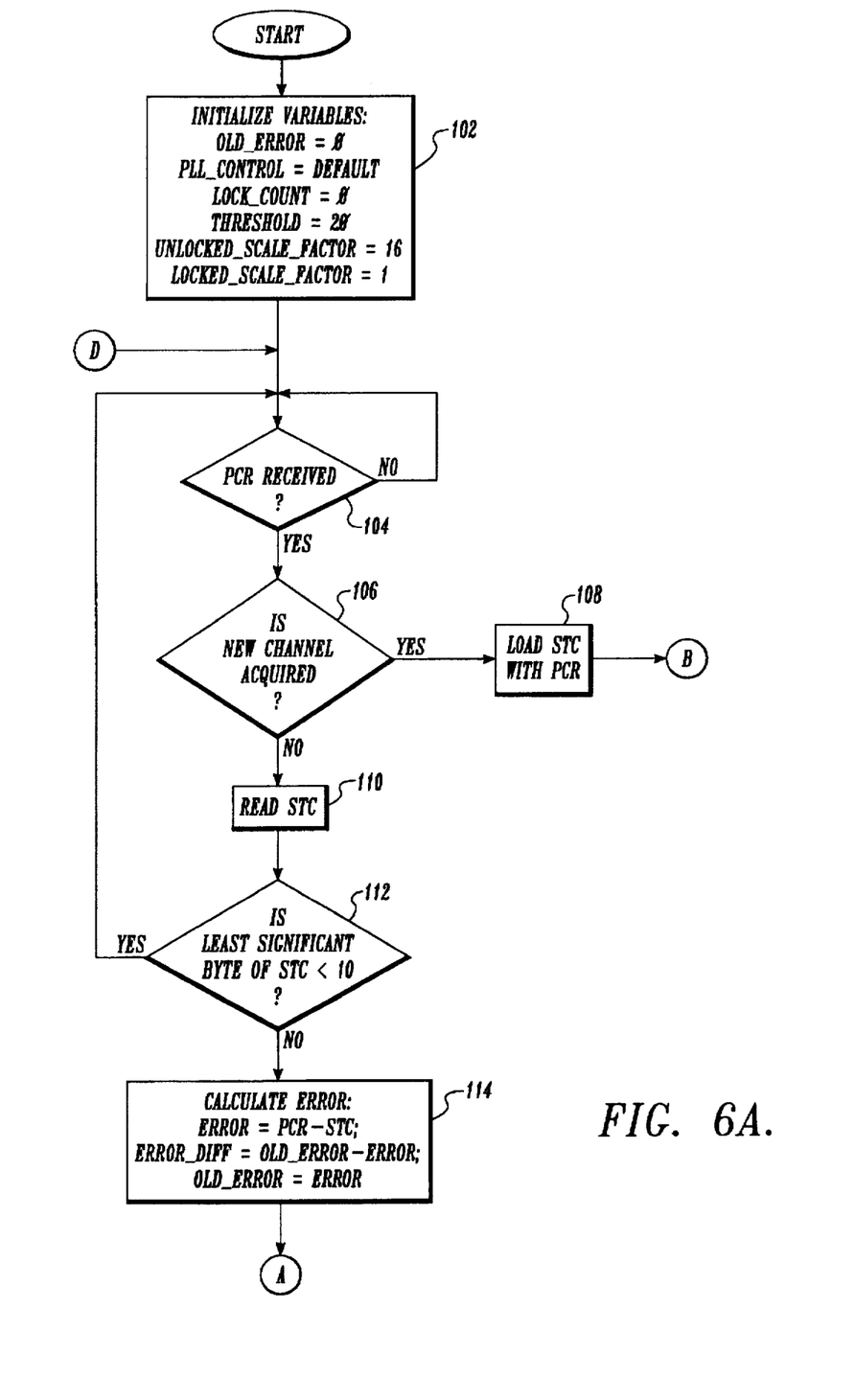
FIGS. 6A–6C are flow charts of a software routine governing the operation of a phase-locked loop for maintaining an accurate decoder clock based on the received PCR values.
Figure 6B:
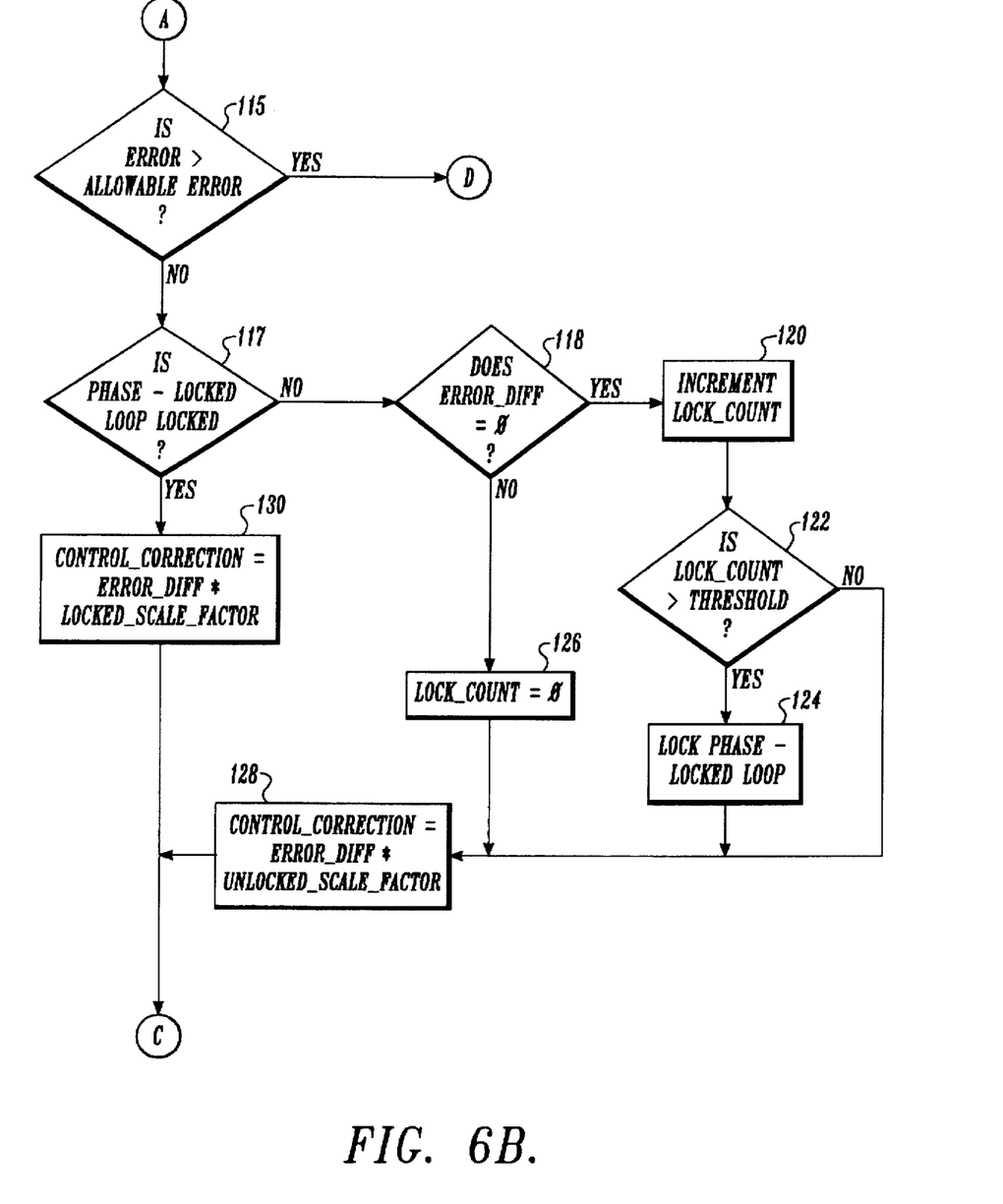
Figure 6C:
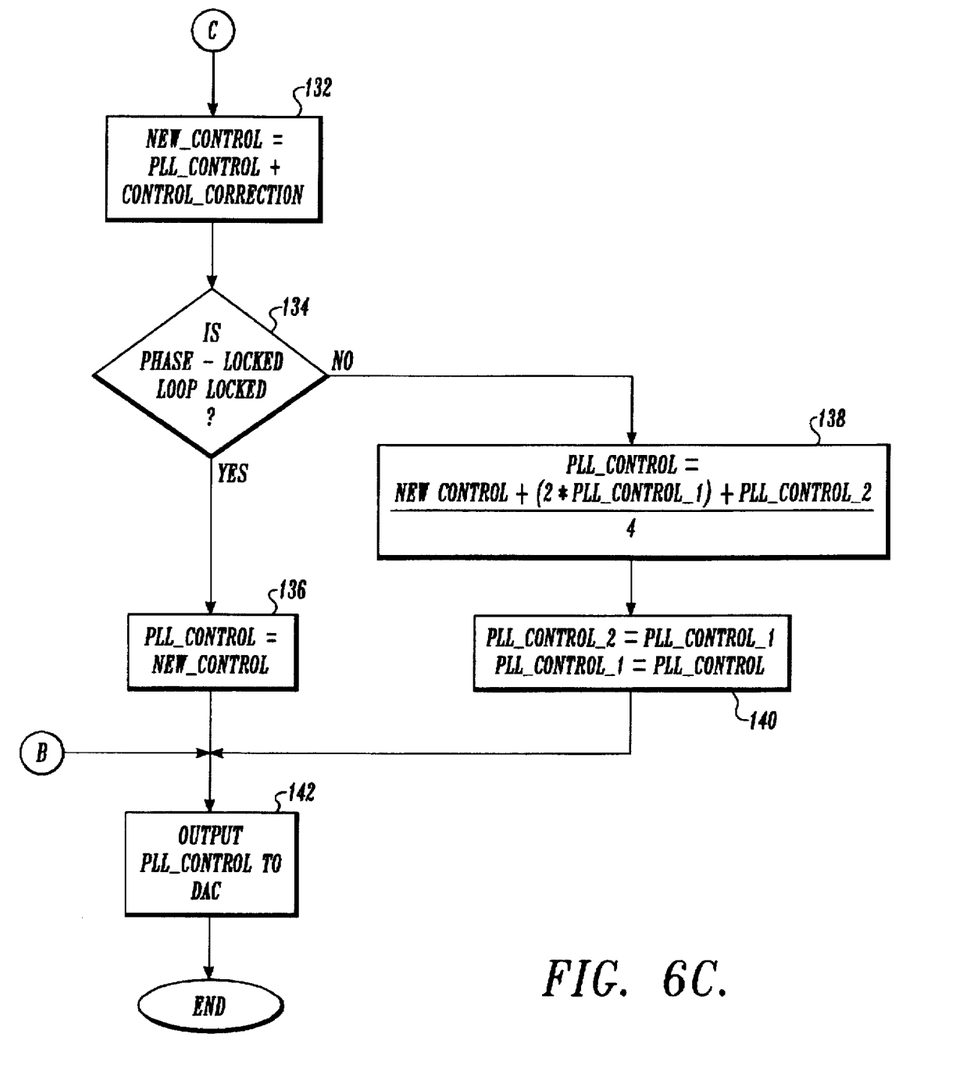

A flowchart of a software routine 100 for controlling the phase-locked loop in clock recovery system 60 is provided in FIGS. 6A–6C. In an exemplary embodiment of the invention, routine 100 is resident in digital signal processor 51. As will be clarified below, the routine encompasses the function of 16-bit subtractor 68 and low-pass digital filter and processor 70 in FIG. 4.

When the decoder begins operation, the variables are initialized to default settings at a block 102 before proceeding to a decision block 104. At decision block 104, the routine waits to detect a PCR contained within a selected one of the programs in the received transport stream. That is, the routine waits to receive a packet having a program identifier (PID) value that corresponds with the PID value of the packet that contains the PCR values for the selected program. A check is then made of the received packet to determine if the PCR is present in the packet. Because the precise frequency of the PCR within the MPEG-2 transport stream is variable, the routine remains in a loop until a PCR is detected within a transport packet adaptation field of the selected program.

When a PCR is detected, a test is made at a decision block 106 to determine if a new channel has been acquired from the transport stream. If a new channel has been acquired, at a block 108 the 16-bit counter that maintains the STC is loaded with the received PCR value. In a preferred embodiment disclosed herein, the least significant 16-bits of the PCR base are loaded into 16-bit counter 64. After loading the 16-bit counter with the PCR base, at a block 142 a default phase-locked loop control variable PLL__CONTROL is output to the digital-to-analog converter. The default value of the variable centers the oscillation frequency of the voltage controlled oscillator, preferably to a frequency of 27 MHz. With reference to FIG. 4, the default control value is applied to the 12-bit digital-to-analog converter 72 which converts the default value into an analog voltage for application to the voltage controlled oscillator. In a situation where a new channel is acquired, the voltage controlled oscillator is therefore adjusted to 27 MHz, and the system time clock is set to the received PCR value.

Returning to FIGS. 6A–6C, if a new channel has not being acquired, at a block 110 the value of the STC is read from the 16-bit counter. As will be appreciated from the above discussion, the STC is a time stamp value indicative of the elapsed 90 kHz counts since the PCR was initially loaded into the 16-bit counter. The period between rollovers of the 16-bit counter is 65,536/90,000=0.728 seconds.

After reading the STC, at a decision block 112 the least significant byte of the 16-bit STC value is examined. If the least significant byte of the STC is less than a predetermined value, in this case ten, the routine returns to a decision block 104 where it waits to receive the next PCR. It will be appreciated that the loop from decision block 112 to decision block 104 is required in the preferred embodiment because the 16-bit counter is implemented using an 8-bit hardware register and an 8-bit software register. As discussed above with respect to FIG. 5, when the hardware register in the 16-bit counter rolls over, an interrupt is generated to increment the software register. Due to the timing involved in receiving and decoding the PCR, a value of less than ten in the hardware register may indicate that an invalid value is present in the software register. That is, due to the time it takes the software routine to increment the software register, it is impossible to determine whether the software register has been appropriately incremented during the period when the hardware register has been incremented from zero to a value less than or equal to ten. At most, the software register may therefore be behind the appropriate count by one. To eliminate any error that may arise in the most significant byte of the STC, preferably the PCR value is discarded and the next PCR searched for. Since the least significant byte of the hardware register counts from zero to 255, only one out of approximately 25 STC values will result in the corresponding PCR being discarded. Statistically, it has been found that missing one out of 25 of the PCR values is insufficient to cause the decoder clock to fall out of synchronization with the encoder clock.

If the least significant byte of the STC is greater than ten, the difference between the PCR and the STC is calculated at a block 114. The difference between the PCR and the STC is the error present between the two clocks when the PCR was received. In addition to calculating the error between the STC and the PCR, at block 114 the difference between the current error and the immediately preceding error measurement is calculated. The difference between the current error and the immediately preceding error is a derivative signal for examining changes in the error signal. If the difference between the current and the preceding error signal is zero (the error signal remains unchanged), the encoder clock and the decoder clock are operating at the same frequency. If the difference is non-zero, the encoder clock and decoder clock are operating at different frequencies. Examining the derivative of the error signal enables frequency locking from phase information, since the frequency is a derivative of the phase.

At a decision block 115, the error is compared with a predetermined allowable error threshold. If the PCR is significantly different from the STC, it is assumed that an error has occurred and the PCR value is discarded. The routine then returns to decision block 104 to wait for the next PCR value.

If the error is not greater than the allowable error, at a decision block 117 a test is made to determine whether the phase-locked loop is "locked." The result of this test determines one of two modes of operation of the routine. In a "coarse" mode of operation, the frequency of the voltage controlled oscillator is rapidly adjusted to quickly bring the decoder clock into synchronism with the encoder clock. In a "fine" mode of operation, the frequency of the voltage controlled oscillator is slowly varied to more finely adjust the decoder clock frequency. When the phase-locked loop is locked, the fine mode of adjustment is enabled, and when the phase-locked loop is unlocked, the course mode of adjustment is enabled. Upon initial start-up, the default setting is that the phase-locked loop is unlocked. Thus, during the first iteration of the routine, the routine proceeds to a decision block 118.

At decision block 118, the error difference is examined to see if the two clocks are diverging or if they are close to one another. If the error difference is zero, indicating that the difference between the PCR and the STC has remained constant, the lock count is incremented at a block 120. After incrementing the lock count, at a decision block 122 the lock count is compared with a threshold value. In a preferred embodiment of the system, the threshold is set at 20. If the lock count exceeds the threshold, the phase-locked loop is locked at a block 124. The routine branch defined by blocks 118 to 124 therefore defines the conditions that must be present for the phase-locked loop to be locked. In a preferred mode of operation, the difference between the PCR and the STC must be constant for at least twenty received PCR values before the phase-locked loop is locked. If at decision block 118 the error difference is not equal to zero, the lock count is reset to zero at a block 126. Thus, the presence of a diverging error between received PCR values immediately resets the lock count and requires an additional twenty error differences of zero before the phase-locked loop is locked.

After blocks 124 and 126, the routine proceeds to a block 128 where the control correction factor is set to be equal to the error difference times an unlocked scale factor. In one embodiment, the unlocked scale factor is equal to sixteen. The control correction factor ultimately dictates the oscillation frequency change of the voltage controlled oscillator. In the case where the phase-locked loop is not locked, the magnitude of the correction that is applied to the voltage controlled oscillator is proportional to the error difference and the unlocked scale factor value. If the difference between subsequent error measurements is large, a greater correction will be applied to the voltage controlled oscillator. In contrast, if the difference between subsequent error measurements is small, a smaller correction will be applied to the oscillation frequency of the voltage controlled oscillator.

The routine branch defined by blocks 118 to 128 calculates a course adjustment of the voltage controlled oscillator frequency. In contrast, if it is determined at decision block 117 that the phase-locked loop is already locked, the routine proceeds to a block 130 where a fine adjustment of the voltage controlled oscillator frequency is calculated. At block 130 the control correction factor is set equal to the error difference times a locked scale factor. In one embodiment of the invention, the locked scale factor is set equal to one. Thus, the control correction factor calculated at block 130 is much smaller than the control correction factor calculated at block 128, as the locked scale factor is much smaller than the unlocked scale factor. Since the control correction factor ultimately dictates the oscillation frequency change of the voltage controlled oscillator, if the phase-locked loop is locked, only fine adjustments need be made to the decoder clock oscillation frequency.

After calculating the control correction factor, at a block 132 the control correction factor is added to the prior PLL_CONTROL variable. Upon start-up, the PLL_CONTROL variable is set to a default value that centers the oscillation frequency of the voltage controlled oscillator. Adding the control correction factor to the prior PLL_CONTROL variable therefore adjusts the frequency of the voltage controlled oscillator by the coarse or fine mount dictated by the control correction factor. The routine then proceeds to a decision block 134, where a test is made to determine whether the phase-locked loop is locked.

At decision block 134, if the phase-locked loop is unlocked, the PLL_CONTROL variable is filtered. At blocks 138 and 140, a simple low-pass filter is implemented by summing the current PLL_CONTROL variable, two times the immediately preceding PLL_CONTROL variable, and one times the second preceding PLL_CONTROL variable. The sum of the PLL_CONTROL variables is then divided by four to produce a weighted average of the last three PLL_CONTROL variables, which is used as the current PLL_CONTROL variable. By low-pass filtering the PLL_CONTROL variable, any rapid changes in the PLL_CONTROL variable caused by the coarse adjustments made to the control correction value will be dampened. After filtering the PLL_CONTROL variable, the PLL_CONTROL variable is output to the digital-to-analog converter at a block 142, ultimately changing the oscillation frequency of the voltage controlled oscillator. When the phase-locked loop is unlocked, coarse adjustments are made to the oscillation frequency of the voltage controlled oscillator to quickly bring the decoder clock frequency to approximately the same frequency as the encoder clock frequency.

If the phase-locked loop is locked at decision block 134, at a block 136 the PLL_CONTROL variable is set equal to the former PLL_CONTROL variable plus the control correction factor. At block 142, the PLL_CONTROL variable is then applied to the digital-to-analog converter, and ultimately to the voltage controlled oscillator. In this manner, when the phase-locked loop is in a locked mode, fine adjustments are made to the oscillation frequency to maintain the frequency of the voltage controlled oscillator at approximately the same frequency as the encoder clock frequency.

It will be appreciated that routine 100 is repeated for each received PCR value to accurately keep the decoder clock frequency approximately the same as the encoder clock frequency. In one embodiment of the invention, accuracies within 3 Hz have been achieved between the encoder and decoder clock frequencies. The 3 Hz accuracy corresponds to the 1 bit resolution of the 12-bit digital-to-analog converter. It will be appreciated that greater accuracy could be achieved by increasing the resolution of the digital-to-analog converter. The additional bits of the digital-to-analog converter would allow even tighter tolerances between the clock frequencies to be achieved, if desired or necessary for a given application.

Several advantages arise from the clock recovery system disclosed herein. Most importantly, the decoder clock within the MPEG-2 decoder is maintained at the same frequency as the encoder clock that encodes the MPEG-2 data for transport over the MPEG-2 transport stream. Accurately synchronizing the two clocks ensures that buffer underflow or overflow does not occur in the MPEG-2 decoder due to differing clock frequencies. The architecture disclosed herein brings the decoder clock within 3 Hz of the encoder clock, and quickly adjusts to fluctuations in the encoder clock by having a course adjustment mode and a fine adjustment mode.

A further advantage of the clock recovery system is that it eliminates the need for a 42-bit counter and subtractor for generating a STC value and comparing the STC value with the PCR value. Instead, the least significant 16 bits of the PCR base are compared with a 16-bit STC value. Implementing the system using a 16-bit counter and a 16-bit subtractor reduces the overall system cost and simplifies the design and operation of the system. Because the 16-bit counter is implemented with an 8-bit hardware register and an 8-bit software register, the overall hardware costs of the clock recovery system are even further reduced. The hybrid software/hardware architecture disclosed herein therefore lends itself to incorporation into an MPEG-2 decoder for mass production and commercialization.

While the preferred embodiment of the invention has been illustrated and described, it will be appreciated that various changes can be made therein without departing from the spirit and scope of the invention. For example, it will be appreciated that the 16-bit counter could be implemented entirely with a 16-bit hardware register, rather than the hybrid hardware/software design disclosed herein. Other combinations could also be envisioned, for example, an implementation using a 12-bit hardware register and a 4-bit software register.

Those skilled in the art will also appreciate that a greater or lesser number than the 16 least significant bits of the PCR base may be used to recover the encoder clock. The 16 least significant bits were selected because they provide a sufficiently long time between rollover of the STC counter. In the described embodiment of the invention, the 16-bit counter will rollover approximately every 0.728 seconds. During this period, at least seven PCR values will be received, allowing a stable phase-locked loop to be implemented. It will be appreciated that additional bits could also be included in the STC counter to increase the period between counter rollovers. It will also be appreciated that a counter can be implemented with less than 16 bits. For example, a 15-bit counter, having a rollover of approximately 0.364 seconds, may be used to recover the encoder clock. The frequency that the PCR values are provided in the MPEG-2 transport stream limits, however, the size of the counter that may be used to implement a stable phase-locked loop. Because PCR values are provided at intervals of no more than 100 ms in the transport stream, in the preferred MPEG-2 environment it is not practical to implement a counter having less than 15 bits due to the short rollover period of the counter. In other environments having time stamps provided at a higher frequency, the counter size may be appropriately reduced.

It will also be appreciated that the software routine described is exemplary in nature and various changes can be made to the routine that controls operation of the phase-locked loop. For example, more complex filtering could be performed on the difference signal, or additional modes of operation could be implemented to advance the decoder clock towards the encoder clock at other than a fine and coarse rate. Consequently, within the scope of the appended claims it will be appreciated that the invention can be practiced otherwise than as specifically described herein.

The embodiments of the invention in which an exclusive property or privilege is claimed are defined as follows:

1. A method of recovering an encoder clock from a digital data stream so that a decoder clock oscillates at approximately the same frequency as the encoder clock in an encoder that generates and encodes a plurality of program clock reference (PCR) values in the digital data stream, each of the plurality of PCR values having a 33 bit base and a 9 bit extension, the method comprising the steps of:

(a) generating a decoder clock having a frequency that varies in response to a received control signal;

(b) parsing a first PCR value from the digital data stream;

(c) loading a number N of the least significant bits of the 33 bit base of the first PCR value into an N-bit counter, N being less than or equal to 33;

(d) dividing the frequency of the decoder clock to produce a counter clock that is synchronized with the decoder clock;

(e) clocking the N-bit counter with the counter clock to produce an N-bit system time clock (STC);

(f) parsing a second PCR value from the digital data stream;

(g) comparing a number N of the least significant bits of the second PCR value with a value of the N-bit STC and generating a control signal proportional to the difference between the second PCR value and the STC value; and (h) using the control signal to adjust the oscillation frequency of the decoder clock, if necessary, to maintain the decoder clock at approximately the same frequency as the encoder clock.

2. The method of claim 1, wherein the digital data stream is an MPEG-2 transport stream.

3. The method of claim 1, wherein N is 16.

4. The method of claim 1, further comprising the steps of:

(a) parsing a plurality of PCR values from the digital data stream;

(b) comparing the least significant N bits of each of the plurality of PCR values with the value of the N-bit STC when each of the plurality of PCR values are parsed; and (c) generating a control signal proportional to the difference between each of the plurality of PCR values and the STC value, the control signal adjusting the oscillation frequency of the decoder clock to maintain the decoder clock at the same frequency as the encoder clock.

5. The method of claim 4, further comprising the step of multiplying the control signal by a scale factor.

6. The method of claim 5, wherein the scale factor is determined by whether a trend of the differences between each of the plurality of PCR values and the STC value indicates that the frequency of the encoder clock and the decoder clock is approximately the same, or the frequency of the encoder clock and the decoder clock is different.

7. The method of claim 6, wherein the scale factor is small when the trend indicates that the frequency of the encoder clock and the decoder clock is approximately the same.

8. The method of claim 1, wherein the frequency of the decoder clock is maintained within 3 Hz of the frequency of the encoder clock.

9. A clock recovery system for recovering an encoder clock from a digital data stream so that a decoder clock oscillates at approximately the same frequency as the encoder clock in an encoder that generates and encodes a plurality of program clock reference (PCR) values in the digital data stream, each of the plurality of PCR values having a 33 bit base and a 9 bit extension, the clock recovery system comprising:

(a) a voltage controlled oscillator for producing a decoder clock, the voltage controlled oscillator having an input that allows the frequency of the decoder clock to be adjusted in proportion to a control signal received on the input;

(b) means for parsing a plurality of PCR values from the digital data stream;

(c) a divider coupled to the voltage controlled oscillator for dividing the decoder clock to produce a counter clock that is synchronized with the decoder clock;

(d) an N-bit counter coupled to the means for parsing a plurality of PCR values from the digital data stream, the N-bit counter having an input that is connected to the divider to produce an N-bit system time clock (STC) that is clocked by the counter clock;

(e) means for loading the N-bit counter with a number N of the least significant bits of the 33 bit base of a first one of the plurality of PCR values, N being less than or equal to 33; and (f) an N-bit comparator for comparing a number N of the least significant bits of a second one of a plurality of PCR values with the value of the N-bit STC when the second one of the plurality of PCR values is parsed from the digital data stream, the N-bit comparator generating a control signal indicative of a difference between the second PCR value and the STC value and applying the control signal to the input of the voltage controlled oscillator to adjust the frequency of the decoder clock and maintain the decoder clock produced by the voltage controlled oscillator at approximately the same frequency as the encoder clock.

10. The clock recovery system of claim 9, wherein N is 16.

11. The clock recovery system of claim 10, wherein the N-bit counter is comprised of an 8-bit hardware register and an 8-bit software register.

12. The clock recovery system of claim 10, wherein the N-bit counter is comprised of a 16-bit hardware register.

13. The clock recovery system of claim 9, wherein the nominal frequency of the decoder clock is 27 MHz.

14. The clock recovery system of claim 13, wherein the divider divides the decoder clock by 300.

15. The clock recovery system of claim 9, wherein the control signal is filtered before application to the voltage controlled oscillator.

16. The clock recovery system of claim 9, wherein the digital data stream is an MPEG-2 transport stream.

17. The clock recovery system of claim 9, further comprising a controller coupled between the N-bit comparator and the voltage controlled oscillator, the controller monitoring the control signal produced by the N-bit comparator and multiplying the control signal by a scale factor.

18. The clock recovery system of claim 17, wherein the scale factor is determined by monitoring a trend of the differences between each of the plurality of PCR values and the STC value to determine whether the frequency of the encoder clock and the decoder clock is approximately the same, or the frequency of the encoder clock and the decoder clock is different.

19. The clock recovery system of claim 18, wherein the scale factor is small when the trend indicates that the frequency of the encoder clock and the decoder clock is approximately the same.

20. The clock recovery system of claim 9, wherein the frequency of the decoder clock is maintained within 3 Hz of the frequency of the encoder clock.

* * * * *